US007018879B2

(12) United States Patent
Wang et al.

(10) Patent No.: US 7,018,879 B2
(45) Date of Patent: Mar. 28, 2006

(54) METHOD OF MAKING AN ULTRATHIN SILICON DIOXIDE GATE WITH IMPROVED DIELECTRIC PROPERTIES USING $NH_3$ NITRIDATION AND POST-DEPOSITION RAPID THERMAL ANNEALING

(75) Inventors: Ming-Fang Wang, Taichung (TW); Chien-Hao Chen, Ilan (TW); Liang-Gi Yao, Hsinchu (TW); Shih-Chang Chen, Taoyuan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 299 days.

(21) Appl. No.: 10/102,414

(22) Filed: Mar. 20, 2002

(65) Prior Publication Data

US 2003/0181012 A1   Sep. 25, 2003

(51) Int. Cl.
*H01L 21/336* (2006.01)
*H01L 21/8234* (2006.01)

(52) U.S. Cl. ............... 438/197; 438/770; 438/787
(58) Field of Classification Search ................ 438/197, 438/770, 787
See application file for complete search history.

(56) References Cited

U.S. PATENT DOCUMENTS 5,258,333 A * 11/1993 Shappir et al. ............. 438/762
6,136,728 A * 10/2000 Wang ......................... 438/773

* cited by examiner

*Primary Examiner*—Long Pham
(74) *Attorney, Agent, or Firm*—Tung & Associates

(57) ABSTRACT

A method of making a semiconductor device having a silicon dioxide based gate with improved dielectric properties including providing a silicon based substrate having active areas defined therein. Thermally growing a silicon dioxide based gate from the silicon based substrate. Nitriding the silicon dioxide based gate to provide a nitrided silicon dioxide based gate and to increase the dielectric constant of the silicon dioxide based gate without substantially increasing thickness of the silicon dioxide based gate.

16 Claims, 4 Drawing Sheets

METHOD OF MAKING AN ULTRATHIN SILICON DIOXIDE GATE WITH IMPROVED DIELECTRIC PROPERTIES USING NH₃ NITRIDATION AND POST-DEPOSITION RAPID THERMAL ANNEALING

FIELD OF THE INVENTION

This invention relates to a method of making an ultrathin silicon dioxide gate with improved dielectric properties by nitriding the silicon dioxide gate using $NH_3$.

BACKGROUND OF THE INVENTION

The ultrathin gate dielectric has been emerged as one of the hardest challenges for further device scaling. Direct tunneling currents restrict the utilization of $SiO_2$ films below approximately 1.5 nm thickness where tunneling currents larger than 1 $A/cm^2$ are observed. Further reduction in thickness will increase tunneling current exponentially. Unacceptable gate leakage currents phase-out this gate dielectric material as early as the 0.1 μm CMOS process. The requirements summarized in the International Roadmap for Semiconductors (ITRS 1999) indicate the equivalent oxide thickness (EOT) progressing to substantially 1.0–1.5 nm for the 0.1 μm notes. No suitable alternative high dielectric constant material and interface layer has been identified with the stability and interface characteristics to serve as a gate dielectric.

To reduce the gate leakage current while maintaining the same gate capacitance, a thicker film with higher dielectric constant is required. Because the direct quantum-mechanical tunneling is exponentially dependent upon the dielectric thickness while the capacitance is only linearly dependent on thickness. For so-call high-K metal oxides, such as $HfO_2$, $ZrO_2$, $Ta_2O_5$, $TiO_2$, unfortunately most of these materials have thermal stability issues. The formation of $SiO_2$ and/or metal silicides takes place when they are deposited on the silicon. Post-deposition annealing is found to be necessary in efforts to further reduce gate leakage current and to densify the film. However, annealing causes the further growth of the $SiO_2$ and silicide, which reduces the effectiveness of any high-K materials. Furthermore, these materials can't endure subsequent high-temperature source/drain and gate activation, which will crystallize the high-K films and thus results in large leakage increase. It is also not clear if any of these materials are compatible with poly-Si gate due to the chemical reactivity with the poly-Si. Therefore, the obstacles for high-K material are not only the discovery and development of a new material, but possibly a complete re-engineering of ever more complicated CMOS processing.

Nitrided oxide or nitride/oxide stack has been emerged as the promising candidate to replace conventional oxide for the urgent requirement in 0.1 μm notes. Nitride/oxide stack preserves the excellent Si/oxide interface and takes the advantages of nitride film. However, there still exists some problems including the significant amount of traps at the oxide/nitride interface and nitride bulk in conventional CVD nitride process, and nitrogen diffuses into and piles up at $Si/SiO_2$ interface during the post-deposition annealing. These problems result in degradation of carrier mobility and become more severe when reducing base oxide thickness. An 8–10 Å oxide base layer has been reported as the optimized base oxide thickness. Further reducing the base oxide thickness results in poor $Si/SiO_2$ interface and thus unacceptable performance degradation. The requirement of a base oxide restricts the down-scaling of nitride/oxide stack. Till now, high performance nitride/oxide stacks with EOT less than 15 Å have not been reported.

For nitrided oxide, many methods have been developed in the past time, such as $N_2O$, NO nitridation, remote plasma nitridation (RPN) on deposited oxide. Oxide films that were either annealed in NO or $N_2O$ typically have total integrated nitrogen concentrations less then 1%. Such small amount of nitrogen concentration is desirable to improve channel hot-carrier degradation effects in transistor. However, it is insufficient to reduce the effects of boron penetration from P+ poly-Si gate into the gate dielectric, especially when oxide thickness down to less than 15 Å. Also, such a small nitrogen concentration didn't effectively reduce the EOT to solve the problem of excess high gate leakage current in ultrathin gate dielectric. Even more, it was observed that NO or $N_2O$ nitridation not only incorporated nitrogen within the film, but also increased the film thickness. In general, this was not viewed as a desirable effect for ultrathin oxide.

Remote plasma nitrided oxides, involving nitridation of thermally grown oxides with a remote high-density nitrogen discharge, are comprised of a thin layer of uniform and high nitrogen concentration at the poly/dielectric interface for an effective barrier to suppress boron diffusion. Through this nitridation, EOT can be effectively reduced due to an increase of dielectric constant. However, when oxide thickness becomes thinner, remote plasma nitridation meets a crucial bottleneck. High-energetic and active nitrogen will easily penetrate through ultrathin oxide, resulting in dramatic thickness increase and unacceptable mobility degradation. Radical induced reoxidation more than offset the EOT reduction from the nitrogen incorporation and limits the down-scaling of remote plasma nitrided oxide.

SUMMARY OF THE INVENTION

One embodiment of the invention includes a method of reducing the equivalent oxide thickness of a silicon dioxide based gate on a semiconductor device includes a silicon based substrate having active areas defined therein including providing a silicon based substrate having active areas defined therein and a silicon dioxide based gate, and introducing nitrogen into the silicon dioxide based gate to increase the dielectric constant of the silicon dioxide based gate to provide a nitrided silicon dioxide based gate.

Another embodiment of the invention includes a method of reducing the equivalent oxide thickness of a silicon dioxide based gate wherein the introducing of the nitrogen into the silicon dioxide based gate comprises heating the silicon dioxide based gate in an atmospheric high concentration of $NH_3$.

Another embodiment of the invention includes a method of reducing the equivalent oxide thickness of a silicon dioxide based gate wherein the introducing of the nitrogen into the silicon dioxide based gate comprises heating the silicon dioxide based gate to a temperature of at least 800° C. in an atmosphere having a high concentration of $NH_3$.

Another embodiment of the invention includes a method of reducing the equivalent oxide thickness of a silicon dioxide based gate further includes annealing the nitrided silicon dioxide based gate to a temperature of at least 900° C. or greater.

Another embodiment of the invention includes a method of reducing the equivalent oxide thickness of a silicon dioxide based gate wherein the annealing of the nitrided silicon dioxide based gate includes heating the nitrided silicon dioxide based gate to a temperature of at least 900° C. in the presence of an atmosphere that prevents the further growth of silicon dioxide and thereby prevents the substantial increase in the thickness of the silicon based dioxide gate.

Another embodiment of the invention includes a method of reducing the equivalent oxide thickness of a silicon dioxide based gate wherein the annealing of the nitrided silicon dioxide based gate includes heating the nitrided silicon dioxide based gate to a temperature of at least 900° C. in the presence of $N_2$.

Another embodiment of the invention includes a method of reducing the equivalent oxide thickness of a silicon dioxide based gate wherein the annealing of the nitrided silicon dioxide based gate includes heating the nitrided silicon dioxide based gate to a temperature of at least 900° C. in the presence of NO.

Another embodiment of the invention includes a method of reducing the equivalent oxide thickness of a silicon dioxide based gate and further including a second annealing of the nitrided silicon dioxide based gate including heating the nitrided silicon dioxide based gate to a temperature of at least 900° C. in the presence of NO.

Another embodiment of the invention includes a method of making a semiconductor device having a silicon dioxide based gate with improved dielectric properties by doping the silicon dioxide based gate including providing a silicon based substrate having active areas defined therein. Thermally growing a silicon dioxide based gate from the silicon based substrate. Doping the silicon dioxide based gate to provide a doped silicon dioxide based gate and to increase the dielectric constant of the silicon dioxide based gate without substantially increasing the thickness of the silicon dioxide based gate.

Another embodiment of the invention includes a method of making a semiconductor device having a silicon dioxide based gate with improved dielectric properties by doping the silicon dioxide based gate and further includes annealing the doped silicon dioxide based gate to a temperature of at least 900° C. or greater.

Another embodiment of the invention includes a method of making a semiconductor device having a silicon dioxide based gate with improved dielectric properties by doping the silicon dioxide based gate wherein the silicon dioxide based gate has a crystalline structure and wherein the doping of the silicon dioxide based gate includes adding nitrogen into the crystalline structure.

Another embodiment of the invention includes a method of making a semiconductor device having a silicon dioxide based gate with improved dielectric properties by doping the silicon dioxide based gate wherein said annealing of the doped silicon dioxide based gate includes heating the doped silicon dioxide based gate to a temperature of at least 900° C. in the presence of an atmosphere that prevents the further growth of silicon dioxide and further prevents the substantial increase in the thickness of the silicon dioxide based gate.

Another embodiment of the invention includes a method of making a semiconductor device having a silicon dioxide based gate with improved dielectric properties by doping the silicon dioxide based gate wherein said annealing of the doped silicon dioxide based gate includes heating the doped silicon dioxide based gate to a temperature of at least 900° C. in the presence of nitrogen.

Another embodiment of the invention includes a method of making a semiconductor device having a silicon dioxide based gate with improved dielectric properties by doping the silicon dioxide based gate wherein said annealing of the doped silicon dioxide based gate includes heating the doped silicon dioxide based gate to a temperature of at least 900° C. in the presence of nitrogen monoxide.

Another embodiment of the invention includes a method of making a semiconductor device having a silicon dioxide based gate with improved dielectric properties by doping the silicon dioxide based gate wherein said growing of the silicon dioxide based gate is conducted so that the silicon dioxide based gate has a thickness less than 22 angstroms.

Another embodiment of the invention includes a method of making a semiconductor device having a silicon dioxide based gate with improved dielectric properties by doping the silicon dioxide based gate wherein said growing of the silicon dioxide based gate is conducted so the silicon dioxide based gate has a thickness ranging from 10–20 angstroms.

Another embodiment of the invention includes a method of making a semiconductor device having a silicon dioxide based gate with improved dielectric properties by nitriding the silicon dioxide based gate including providing a silicon based substrate having active areas defined therein. Thermally growing a silicon dioxide based gate from the silicon based substrate. Nitriding the silicon dioxide based gate to provide a nitrided silicon dioxide based gate and to increase the dielectric constant of the silicon dioxide based gate without substantially increasing the thickness of the silicon dioxide based gate.

Another embodiment of the invention includes a method of making a semiconductor device having a silicon dioxide based gate with improved dielectric properties by nitriding the silicon dioxide based gate wherein said growing of the silicon dioxide based gate includes heating the silicon based substrate in a wet oxygen atmosphere.

Another embodiment of the invention includes a method of making a semiconductor device having a silicon dioxide based gate with improved dielectric properties by nitriding the silicon dioxide based gate wherein said heating of the silicon based substrate is conducted so that the silicon based substrate has a temperature of at least 900° C.

Another embodiment of the invention includes a method of making a semiconductor device having a silicon dioxide based gate with improved dielectric properties by nitriding the silicon dioxide based gate further including annealing the nitrided silicon dioxide based gate to a temperature of at least 900° C. or greater.

Another embodiment of the invention includes a method of making a semiconductor device having a silicon dioxide based gate with improved dielectric properties by nitriding the silicon dioxide based gate wherein said annealing of the nitrided silicon dioxide based gate includes heating the nitrided silicon dioxide based gate to temperature of at least 900° C. in the presence of an atmosphere that prevents the further growth of silicon dioxide and thereby prevents substantial increase in the thickness of the silicon dioxide based gate.

Another embodiment of the invention includes a method of making a semiconductor device having a silicon dioxide based gate with improved dielectric properties by nitriding the silicon dioxide based gate wherein said annealing of the nitrided silicon dioxide based gate includes heating the nitrided silicon dioxide based gate to a temperature of at least 900° C. in the presence of nitrogen.

Another embodiment of the invention includes a method of making a semiconductor device having a silicon dioxide based gate with improved dielectric properties by nitriding the silicon dioxide based gate wherein said annealing of the nitrided silicon dioxide based gate includes heating the nitrided silicon dioxide based gate to a temperature of at least 900° C. in the presence of nitrogen monoxide.

Another embodiment of the invention includes a method of making a semiconductor device having a silicon dioxide based gate with improved dielectric properties by nitriding the silicon dioxide based gate wherein said growing of the silicon dioxide based gate is conducted so that the silicon dioxide based gate has a thickness less than 22 angstroms.

Another embodiment of the invention the includes a method of making a semiconductor device having a silicon dioxide based gate with improved dielectric properties by nitriding the silicon dioxide based gate wherein thermally growing of the silicon dioxide based gate is conducted so that the silicon dioxide based gate has a thickness ranging from 10–20 angstroms.

Another embodiment of the invention includes a method of making a semiconductor device having a silicon dioxide based gate with improved dielectric properties including providing the silicon based substrate having active areas defined therein. Heating the silicon based substrate in the presence of wet oxygen to grow a silicon dioxide based gate. Heating the silicon dioxide based gate in the presence of $NH_3$ to provide a nitrided silicon dioxide based gate and to increase the dielectric constant of the silicon dioxide based gate without substantially increasing the thickness of the silicon dioxide based gate.

Another embodiment of the invention includes a method of making a semiconductor device having a silicon dioxide based gate with improved dielectric properties and further including driving out any hydrogen remaining in the nitrided silicon dioxide based gate.

Another embodiment of the invention includes a method of making a semiconductor device having a silicon dioxide based gate with improved dielectric properties and further including heating the nitrided silicon dioxide based gate to a temperature of at least 900° C. in the presence of nitrogen.

Another embodiment of the invention includes a method of making a semiconductor device having a silicon dioxide based gate with improved dielectric properties and further includes heating the nitrided silicon dioxide based gate to a temperature of at least 900° C. in the presence of nitrogen monoxide.

Another embodiment of the invention includes a method of making a semiconductor device having a silicon dioxide based gate with improved dielectric properties and further includes heating the nitrided silicon dioxide based gate to a temperature of at least 900° C. in the presence of nitrogen, and thereafter heating the nitrided silicon dioxide based gate to a temperature of at least 900° C. in the presence of nitrogen monoxide.

These and other objects, features and advantages of the present invention will be apparent from the following brief description of the drawings, detailed description of the preferred embodiments, and appended claims and drawings.

DETAILED DESCRIPTION OF THE PREFERRED EMBODIMENTS

Figure 1:
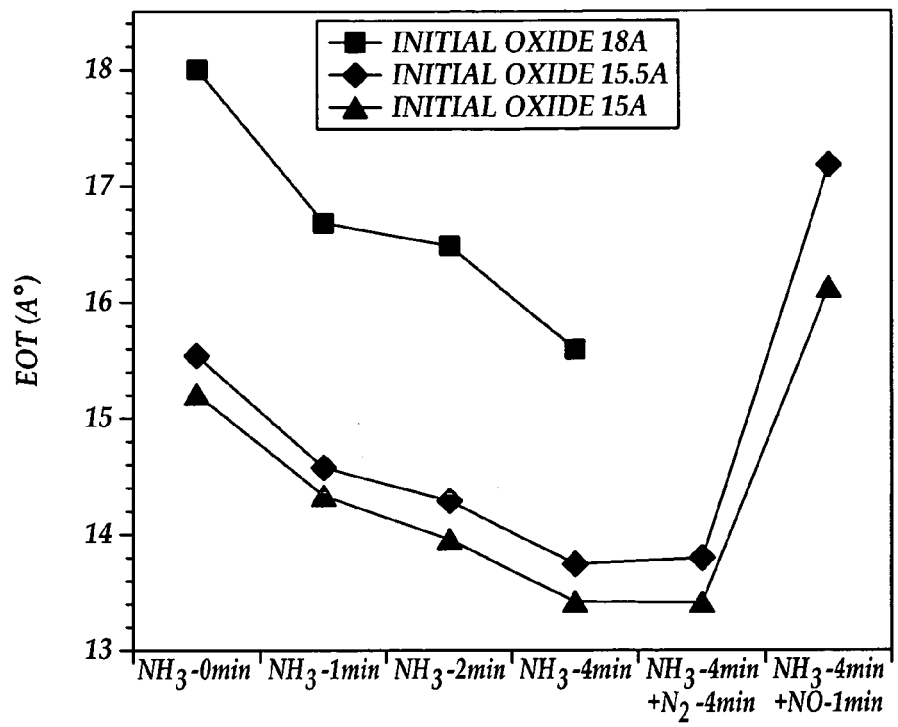
FIG. 1 shows the variation of equivalent oxide thickness (EOT) under different $NH_3$ nitridation conditions according to the present invention.

In this work, we profoundly investigate the feasibility and characteristics of ultrathin (EOT 13–16 Å) $NH_3$ nitrided oxides. Oxide thickness was thick in the past time, and most of the studies of $NH_3$ nitridation performed on these thick oxides were focused on the reliability improvement accompany with the nitrogen incorporation. No attention was paid on the EOT reduction through nitridation. For thick oxide (~100 Å), 2–3 Å EOT reduction shows little influence on the characteristics. However, for oxide thickness down to the range of 10–20 Å in direct tunneling region, 2 Å EOT reduction can contribute to one order lower in gate leakage current. Opposite to the $N_2O$ nitridation and RPN which will cause an increase in film physical thickness, $NH_3$ nitridation not only effectively introduce the nitrogen into gate oxide but also essentially keep unchanged in physical thickness. This property indicates the promising for $NH_3$ nitridation in oxide equivalent thickness downscaling. The results in this study show that 2–3 Å EOT reduction can be obtain through $NH_3$ nitridation at 900° C. for about 2 minutes. More than one order improvement in reducing gate leakage current is observed, depending on the nitridation recipe. Also, we deeply investigate the origins of different behaviors in gate leakage current and in flatband voltage shift between NMOS and PMOS after performing $NH_3$ nitridaton. Significant larger barrier height lowering in valence band than in conduction and sub-oxide band modification contribute to inferior gate leakage current reduction for PMOS. Boron penetration in ultrathin oxide and the gate type-dependence on nitrided oxide result in larger flatband voltage shift in PMOS. For the performance concern, $NH_3$ nitrided oxide shows significant improvement in drain driving current for NMOS. However, drivability degradation in PMOS was observed, and become the critical limit for the feasibility of $NH_3$ nitridation. Fortunately, through the optimized nitridation duration and subsequent post-deposition annealing, this driveability degradation can be largely reduced to meet the process target. Finally, the time to breakdown characteristic of $NH_3$ nitrided oxide was exanimate to guarantee the reliability for 0.1 μm CMOS process application.

Experimental

N-and P-channel MOSFETs samples were fabricated on p-type Si(100) wafer using dual gate, twin-well CMOS technology. After trench isolation and active area definition, oxide films of 15–18 Å thickness were thermally grown in wet oxygen. The oxides were then nitrided at 900° C. for 1–4 minutes in $NH_3$ ambient. Hereafter, some of these nitrided oxides were annealed in $N_2$ or NO gas at 1050° C. for 2–4 minutes. After the preparation of gate dielectrics, undoped polysilicon deposition, As/$BF_2$ implantation, and patterning, source/drain junction formation was performed respectively. The source/drain activation annealing was done at 1075° C. by spike annealing. Then, Cobalt salicide formation, PSG deposition, and contacts defining were executed on sequence. Finally, copper metalization was done to prepare samples for electrical characterization.

FIG. 1 shows the variation of equivalent oxide thickness (EOT) under different $NH_3$ nitridation conditions. EOT is extracted from the measured high-frequency (100 KHz) C-V curves by CV simulator, which takes into account poly-Si gate depletion effect and quantum mechanis. Obviously, increasing $NH_3$ nitridation duration can effectively reduce the EOT. Through $NH_3$ nitridation, the physical thickness of the film remains essentially unchanged, as shown in the insert of FIG. 1. It is opposite to the $N_2O$ nitridation or temperature enhanced remote plasma nitridation (TE-RPN) on ultrathin oxide, which cause the oxide physical thickness ($T_{physical}$) increase largely due to the oxygen or radical induced reoxidation. The $NH_3$ nitridation treatment effectively introduces the nitrogen into the oxide, increases the dielectric constant, keeps the physical thickness unchanged, and thus lowers the EOT. The EOT decreases with $NH_3$ nitridation time, but the amount of EOT reduction is slightly retarded for longer nitridation duration. This is contributed to the self-limitation property of the nitrogen, which the increase of incorporated nitrogen concentration slows as nitridation time increase. Although this self-limitation, as illustrated in the FIG. 1, the gate dielectric with EOT less than 14 Å can be easily achieved to meet the 0.1 μm CMOS process notes. Furthermore, as gate dielectric thickness down to direct tunnel region, the advantage of one order lower in gate leakage can be obtained for 2 Å EOT reduction.

On other hand, post-nitridation anneals (PNA) in $N_2$ or NO ambiences are performed for structure stabilization and defect minimization. However, in the consideration of the EOT reduction for 0.1 μm CMOS applications, the $N_2$ PNA exhibits superior behavior than NO PNA. $N_2$ PNA keeps EOT unchanged, while the NO PNA results in the large thickness increase, due to the oxygen induced reoxidation. The thickness increases by NO PNA even more than offsets the EOT reduction by NH3 nitridation treatment.

Figure 2:
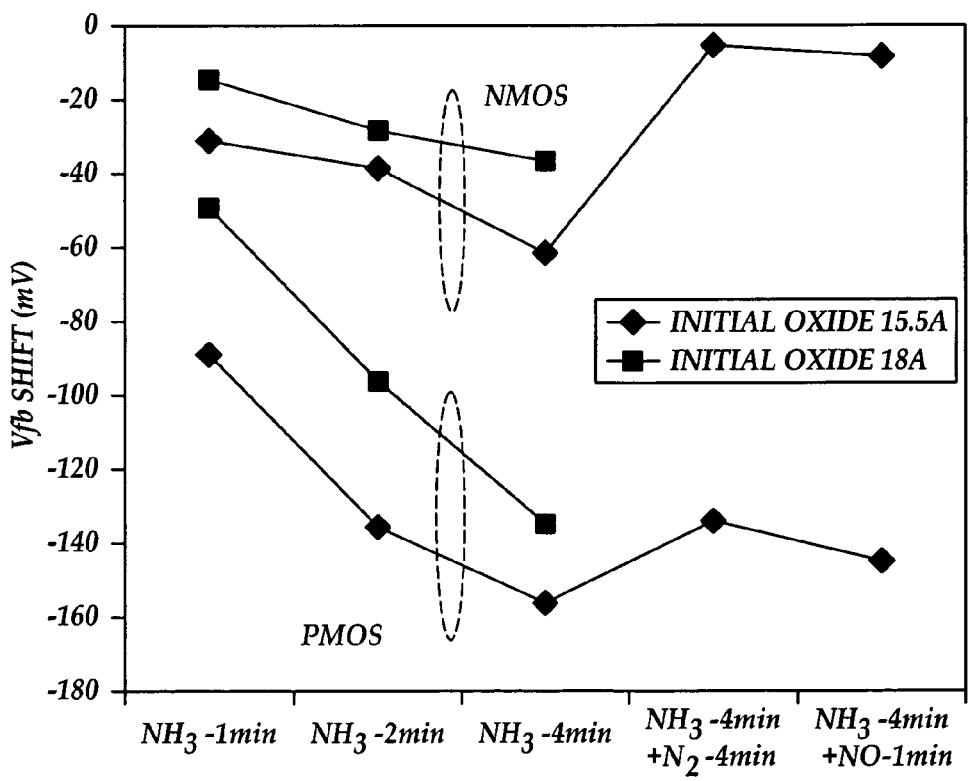
FIG. 2 illustrates the flat-band voltage (Vfb) shift for both NMOS and PMOS with $NH_3$ nitrided oxide under different $NH_3$ nitridation treatment.

FIG. 2 illustrates the flat-band voltage (Vfb) shift for both NMOS and PMOS with $NH_3$ nitrided oxide under different $NH_3$ nitridation treatment. Vfb shift is extracted from measured C-V curves and is defined as the Vfb difference between control oxide and $NH_3$ nitride oxide. Vfb is shift negatively due to the fixed positive charges generation accompany with the incorporated nitrogen. Vfb shift increases with the increase of nitridation time and with the decrease of initial oxide thickness. Longer nitridation time results in larger amount of nitrogen incorporation. The thinner initial oxide makes the nitrogen easily diffuse into and pile up at the Si-oxide interface. Furthermore, PNA shows the large influence on the Vfb shift. Post-nitridation anneals (PNA) in $N_2$ or NO ambiences are performed to stabilize the film structure, drive the hydrogen out, and minimize the electrical defects. It has been reported that the hydrogen reduction is independent of annealing gas, indicating thermally activated out-diffusion of hydrogen from the film. Hence, both $N_2$ and NO PNA can effectively reduce the Vfb shift in the $NH_3$ nitrided oxide, since the positive fixed charges in the films is due to N-H bond at the interface.

Through $NH_3$ nitridation treatment, it is worthy to note the flat-band voltage shifts in PMOS are larger than that in NMOS. The similar results have been observed in remote plasma oxynitride and Nitride/Oxide stacks. The following mechanisms are attribute to these phenomena. As proposed by Wu et al., " The performance and reliability of PMOSFETs with ultrathin silicon nitride/oxide stacked gate dielectrics with nitrided $Si-SiO_2$ interfaces prepared by remote plasma enhanced CVD and post-deposition rapid thermal annealing," IEEE Transactions on Electron Devices, vol. 47, NO.7, p.1361–1362, 2000, the larger flat-band voltage shift in PMOS comes from the boron penetration in the oxide device, verifying by the anticipated value of flat-band voltage as calculated from the poly-Si gate and substrate doping concentration in control oxide device. Furthermore, it has been claimed that there is a high density of empty donor-like interface states at the nitride/P+ poly gate interface, resulting in a net positive charge for PMOS.

Figure 3:
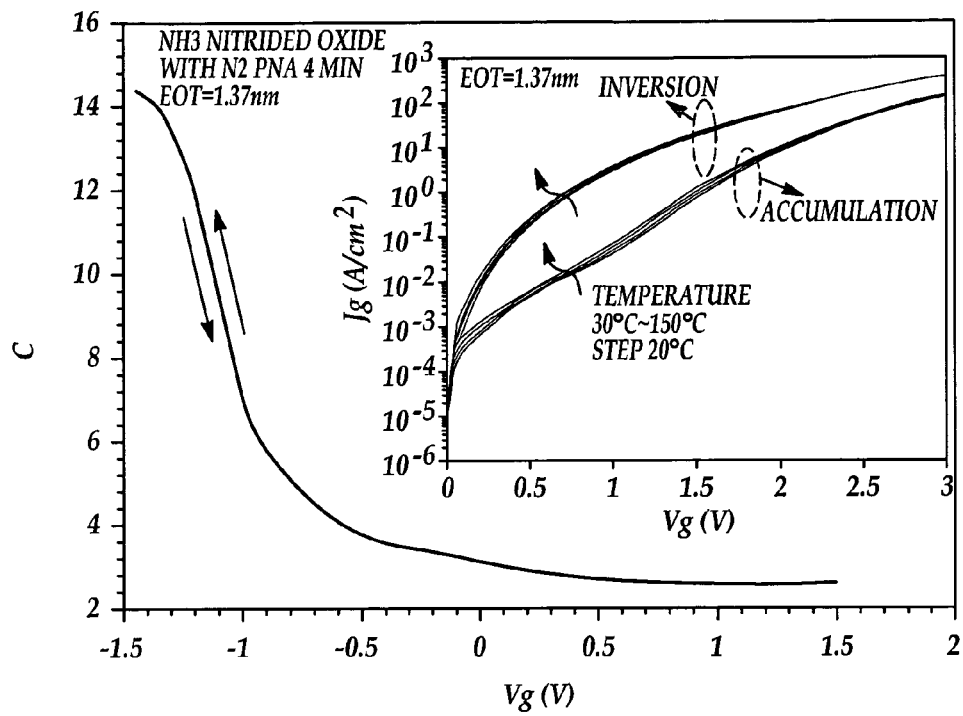
FIG. 3 illustrates the hysteresis characteristic of $NH_3$ nitrided oxide and the insert demonstrates the gate leakage current under different temperature (30–150° C.) wherein $NH_3$ nitrided oxide exhibits little amount of hysteresis and shows very weak temperature dependence on gate leakage current.

The C-V traces of the $NH_3$ nitrided oxide are shown in FIG. 3. The trace/retrace indicated by the arrows show negligible amount of hysteresis in C-V curves. No hysteresis implies little amount of bulk traps was contained in the nitrided oxide. The limited of traps is probably contributed to the post-deposition annealing on the thin film, which effectively reduces excess Si atoms and H-related species, such as Si-H bonds in the nitrided film. In general, the dominant current in conventional CVD nitride is the Frenkel-Poole (F-P) conduction mechanism due to a high density of traps and is very sensitive to temperature variation. As the insert of FIG. 3 shows, $NH_3$ nitrided oxide shows week temperature dependence. This indicates the face that the dominant conduction mechanism in $NH_3$ nitrided oxide is tunneling and also verifies a relatively low density of traps in the bulk.

Figure 4:
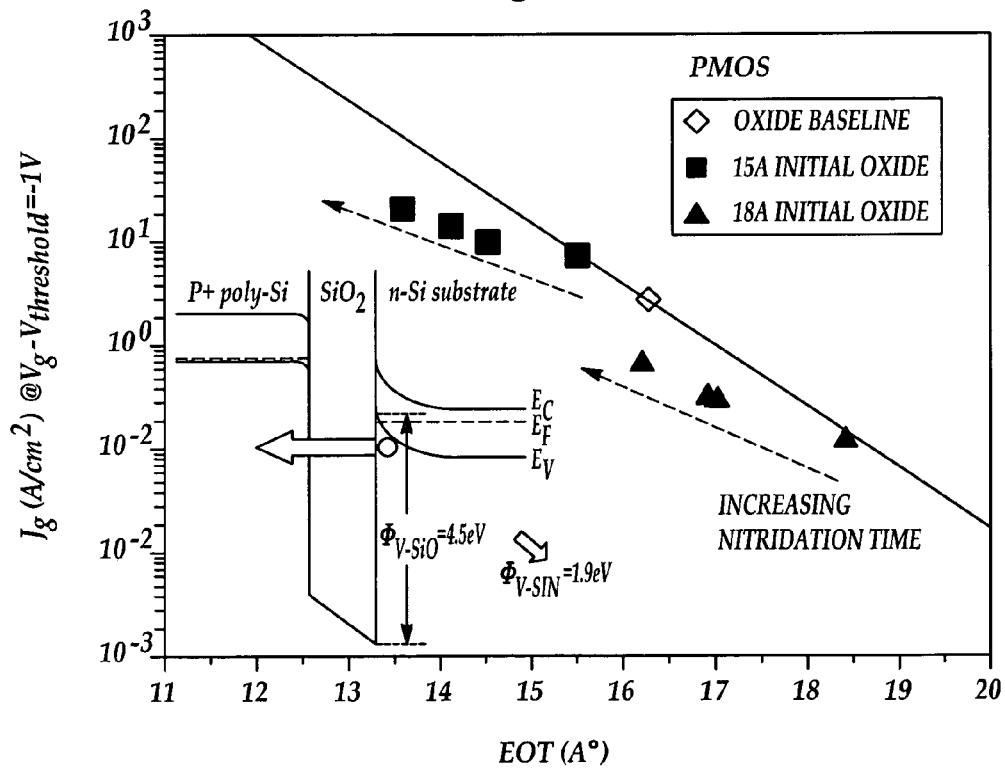
FIG. 4 shows the measured gate leakage current density (Jg) in inversion region as a function of equivalent oxide thickness (EOT) for $NH_3$ nitrided PMOS.
Figure 5:
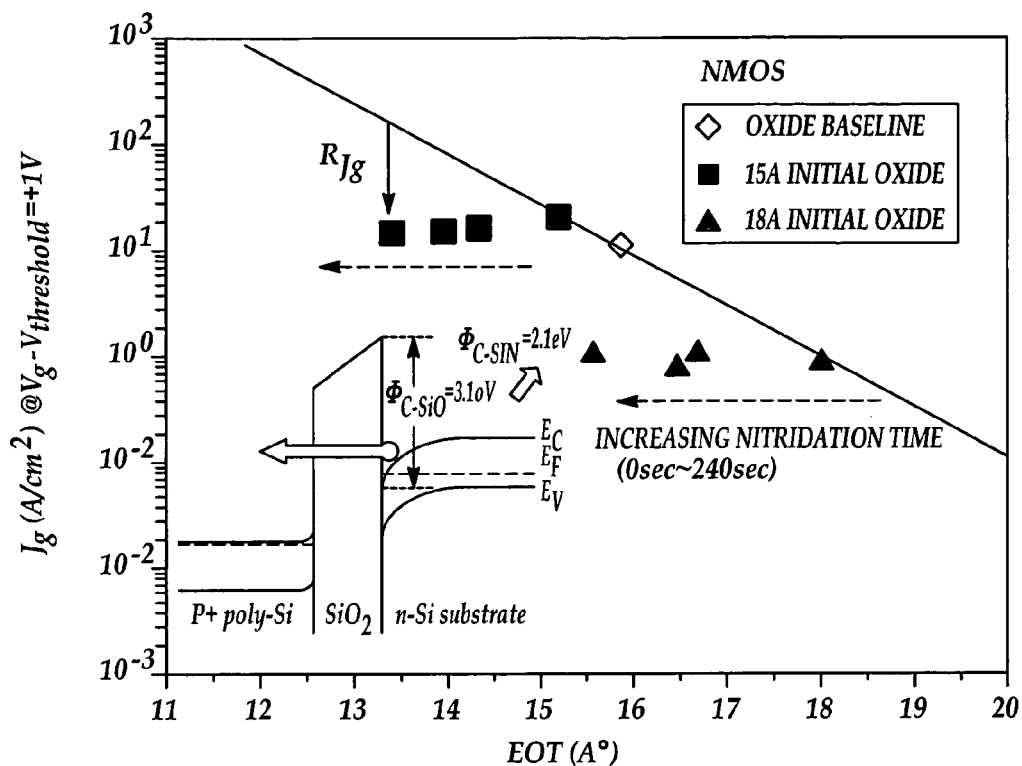
FIG. 5 shows the measured gate leakage current density (Jg) in inversion region as a function of equivalent oxide thickness (EOT) for $NH_3$ nitrided NMOS.

FIG. 4 and FIG. 5 show the measured gate leakage current density (Jg) in inversion region as a function of equivalent oxide thickness (EOT) for NH3 nitrided PMOS and NMOS respectively. The gate leakage currents are compared at normalized voltages $|V_g-V_{threshold}|=1V$, which can normalize the differences in V fb (and thus threshold voltage) among the various gate dielectric recipes. As the nitridation time increases, the Jg of PMOS is profoundly raised in contrast to the slightly change in NMOS. In the case of 1.5 nm oxide with longer nitridation, the Jg in PMOS is even larger than that in NMOS. This means that the nitrided oxide's scaling limit for excessive tunneling leakage current may be faster attended in PMOS, which is opposite to the observation for conventional oxide. Although the Jg increases during $NH_3$ nitridation treatment, the advantages of the EOT decrease still more than offset the Jg increase. Comparing to conventional oxide with identical EOT, nitrided oxide exhibits larger physical thickness thus ends in superior behavior in gate leakage. One order magnitude of leakage current reduction can be obtained through $NH_3$ nitridation treatment.

In an effort to interpret the different Jg behavior between NMOS and PMOS, the direct tunneling models are applied. The gate current in the inversion region is predominately due to the direct tunneling from the inversion layer to the gate electrode and is supplied by source and drain. As illustrated in the insert of FIG. 4 and FIG. 5, hole (or electron) tunneling form the valence (or conduction) bands in the channel of PMOS (or NMOS) dominants the gate leakage current. It has been reported that the tunneling probability is qualitatively related to the area of the tunneling barrier. The barrier heights of oxynitride decrease monotonically with increasing nitrogen concentration. Increasing $NH_3$ nitridaton time results in lower barrier height but the physical thickness is not affected, so that the gate leakage current is increased with the increasing nitridation time.

Furthermore, the barrier heights in valence band ($\Phi v$) and in conduction band ($\Phi_c$) of MOS with $Si_3N_4$ gate dielectric are 1.9 eV and 2.1 eV respectively. Thus, during $NH_3$ nitridation on oxide, ($\Phi v$) will be dramatically decreased from 4.5 toward 1.9 eV while ($\Phi_c$) only slightly decreased form 3.1 toward 2.1 eV. The amount of barrier height lowing depends on the nitridation duration. The decreasing degree of ($\Phi v$) is significantly larger than ($\Phi_c$) The significant lowering of ($\Phi v$) leads to the increasing of the hole tunneling probability for PMOS profoundly.

It is interesting that the Jg in NMOS didn't increase with the $NH_3$ nitridation time.

As Hanyang Yang et al. "The effects of interfacial sub-oxide transition regions and monolayer level nitridation on tunneling currents in silicon devices," IEEE Electron Device Letter, vol. 21, no.2, p. 76–78, 2000, reported that the interface nitridation can modify the band structure at interfacial sub-oxide transition region to reduce tunneling probability. $NH_3$ nitridation causes nitrogen pile-up at the interface, hence, this band modification effect probably offsets the slightly conduction band lowering in NMOS, thus no Jg increase in NMOS during $NH_3$ nitridation. In PMOS, however, the significant ($\Phi v$) lowering dominates the Jg, resulting in larger gate leakage increasing in PMOS than in NMOS while increase nitridation time.

The mobility behaviors of oxynitride have been well investigated for decades, where the lowering of the low field peak mobility is attributed to an increase in the scattering rate due to the present of nitrogen. And as Hori et al. "Improved transconductance under high normal field in MOSFET's with ultrathin nitrided oxides," IEEE Transactions on Electron Devices, vol. 10, p.195, 1989 hypothesized that the nitrogen incorporation at the interface reduces the acceptor interfacial states above the conduction band while increasing the donor interfacial states below the valence band. This contributes to the improvement of electron high filed mobility and the deterioration of hole high filed mobility. Similar phenomena can be observed in transconductance (Gm) characteristics of $NH_3$ nitrided oxide in linear region. The improvement in NMOS and the degradation in PMOS become more obvious in saturation region, as demonstrated in FIG. 5.

Figure 6:
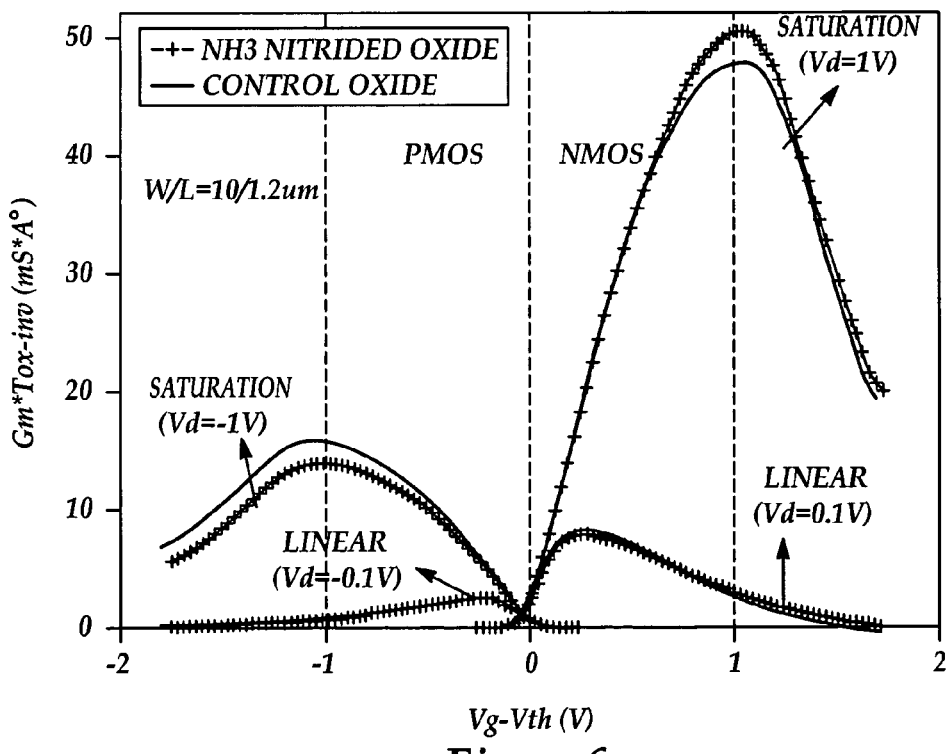
FIG. 6 shows the normalized drain current driveability for $NH_3$ nitrided oxides compared to control oxides.

FIG. 6 shows the normalized drain current drivability for $NH_3$ nitrided oxides compared to control oxides. Drain currents are determined from long channel devices (W/L=10/0.5 µm) to avoid the short channel effects and the uncertainties in source/drain series resistance. Drain currents are measured at |Vg−Vth|=|1V| in inversion (operating condition for 0.1 µm process ), and normalized with electrical thickness. For transistors with ultrathin gate dielectrics, the gate electrical fields are quit large under operating condition. This indicates that the operating drain current is dominated by the high field mobility. Comparing to control oxide devices, as illustrated in the FIG. 6, NMOS's with $NH_3$ nitrided oxides show remarkable improvements for current drivability. $NH_3$ nitridation results in an increase in driving current over control oxide, however, longer nitridation times end in smaller amount of improvement. For 4 minutes nitridation, current drivability is even inferior to control oxide. Hence, too severe nitridation should be avoided to preserve superior drivability. In case of PMOS, driving current in $NH_3$ nitrided device is lower than control oxide due to an increase in donor interfacial states below the valence band. The driving current is observed to decrease with increasing nitridation time and with decreasing initial oxide thickness. This drivability deterioration is more progressive in PMOS than in NMOS.

Fortunately, drivability degradation can be significantly improved by post-nitridation annealing, as FIG. 6 shown. In case of 15.5 Å initial oxide with 4 minutes nitridation, unacceptable drivability degradation (21%) in PMOS can be relieved to 11% by $N_2$ PNA and to 7% by NO PNA. In NMOS, slightly degradation (2%) can be eliminated and turns to 5–6% improvement by PNA. Obviously, 2 minutes nitridation with N2 or NO PNA can be chose as the optimized receipt to meet acceptable driveability degradation (5%) for 0.1 µm CMOS process notes. Also, it is worth to note that NO PNA shows higher efficiency than $N_2$ PNA in improving driving current. That is because NO PNA not only stabilizes the film, drives out the hydrogen but also reoxidize the substrate/oxide interface. However, this oxidization causes the film thickness to increase.

Figure 7:
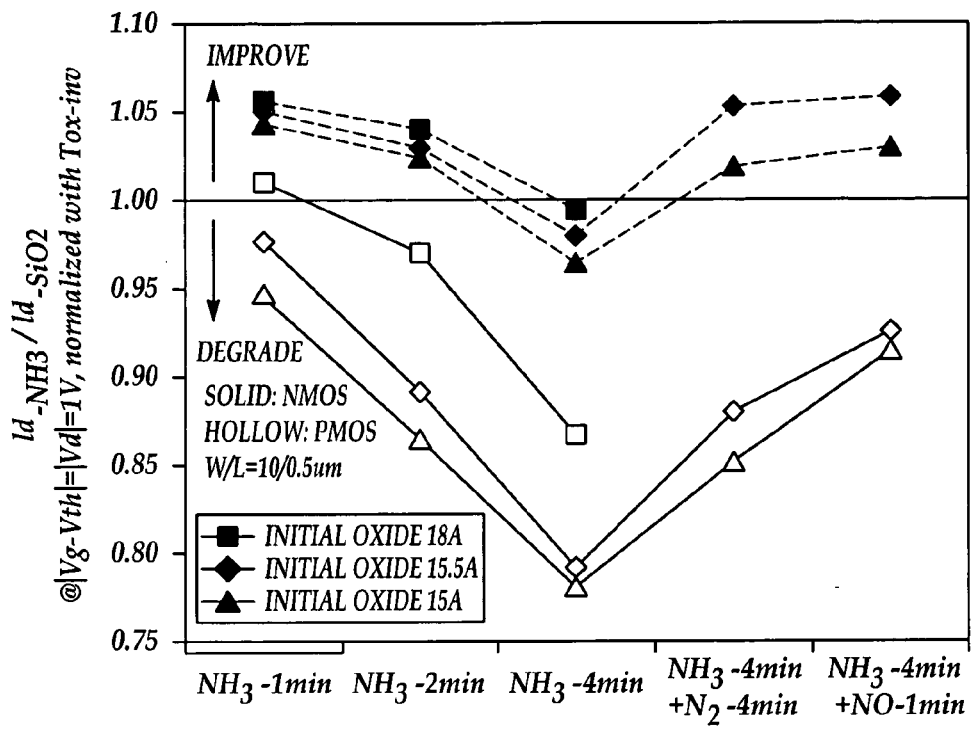
FIG. 7 illustrates the normalized drain current driveability under different $NH_3$ nitridation recipes.

FIG. 7 illustrates the normalized drain current drivability under different $NH_3$ nitridation recipes. Significant drivability improvement is obtained in NMOS. The drivability degradation can be largely relieved by PNA.

Figure 8:
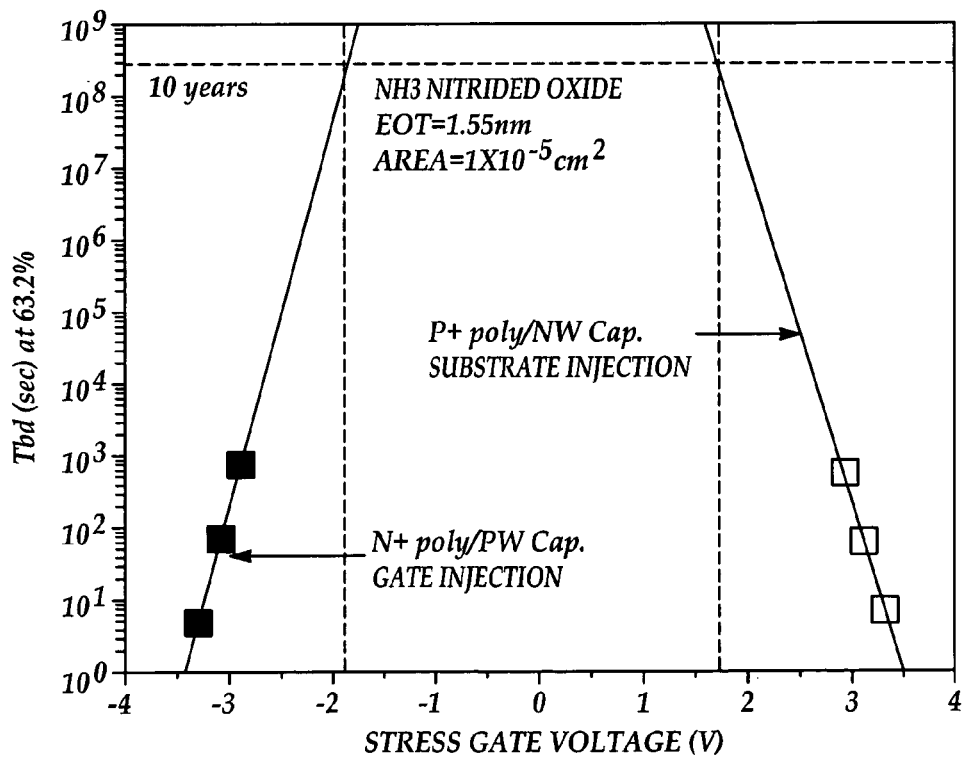
FIG. 8 shows the time to breakdown characteristics of ultrathin $NH_3$ nitrided oxide.

FIG. 8 shows the time to breakdown characteristics of ultrathin $NH_3$ nitrided oxide. For ultra-thin oxide reliability evaluation, because of the occurrence of so-called soft breakdown modes, the definition of oxide breakdown events becomes questionable. In addition, significantly larger direct tunneling currents can complicated the definition of oxide breakdown. Furthermore, for oxides less than 5 nm in ballistic FN tunneling and direct tunneling regimes, the constant voltage stress should be used rather than constant current stress . Oxide breakdown in this work is taken strictly to be the first sudden change in stress current under constant voltage stress. As FIG. 8 shows, both under substrate and gate injection, $NH_3$ nitrided oxide shows quite good reliability characteristics. Projected gate voltage for 10 year lifetime of $NH_3$ nitrided oxide is as high as 1.7–1.9 V, which is much higher than the operating voltage for 0.1 µm process (1 V). This guarantees the reliability properties of $NH_3$ nitrided oxide for 0.1 µm notes.

What is claimed is:

1. A method of making a semiconductor device having a gate dielectric of silicon dioxide with improved dielectric properties by doping the gate dielectric of silicon dioxide, comprising:
    providing a silicon based substrate having active areas defined therein;
    thermally growing the gate dielectric of silicon dioxide from the silicon based substrate so that the gate dielectric of silicon dioxide has a thickness less than 22 angstroms;
    doping the gate dielectric of silicon dioxide to provide doped gate dielectric of silicon dioxide and to increase the dielectric constant of doped gate dielectric of silicon dioxide without substantially increasing the thickness of the gate; and
    annealing doped gate dielectric of silicon dioxide to a temperature of at least 900° C. or greater.

2. The method as set forth in claim 1 wherein said annealing of doped gate dielectric of silicon dioxide includes heating doped gate dielectric of silicon dioxide to a temperature of at least 900° C. in the presence of an atmosphere that prevents the further growth of silicon dioxide and thereby prevents the substantial increase in the thickness of doped gate dielectric of silicon dioxide.

3. A method as set forth in claim 1 wherein said annealing of doped gate dielectric of silicon dioxide includes heating doped gate dielectric of silicon dioxide to a temperature of at least 900° C. in the presence of $N_2$.

4. A method as set forth in claim 1 wherein said annealing of doped gate dielectric of silicon dioxide includes heating doped gate dielectric of silicon dioxide to a temperature of at least 900° C. in the presence of NO.

5. A method of making a semiconductor device having a gate dielectric of silicon dioxide with improved dielectric properties by nitriding the gate dielectric of silicon dioxide, comprising:

providing a silicon based substrate having active areas defined therein;

thermally growing the gate dielectric of silicon dioxide from the silicon based substrate so that the gate dielectric of silicon dioxide has a thickness less than 22 angstroms;

nitriding the gate dielectric of silicon dioxide to provide a nitrided gate dielectric of silicon dioxide gate and to increase the dielectric constant of the gate dielectric of silicon dioxide without substantially increasing the thickness of the silicon dioxide based gate; wherein said growing of the gate dielectric of silicon dioxide comprises heating the silicon based substrate in a wet oxygen atmosphere, so that the silicon based substrate has a temperature of at least 900° C.

6. A method as set forth in claim 5 further comprising annealing the nitrided gate dielectric of silicon dioxide to a temperature of at least 900° C. or greater.

7. A method as set fort in claim 6 wherein said annealing of the nitrided gate dielectric of silicon dioxide includes heating the nitrided gate dielectric of silicon dioxide to a temperature of at least 900° C. in the presence of an atmosphere that prevents the further growth of silicon dioxide and thereby prevents the substantial increase in the thickness of the gate dielectric silicon dioxide.

8. A method as set forth in claim 6 wherein said annealing of the nitrided gate dielectric of silicon dioxide includes heating the nitrided gate dielectric of silicon dioxide to a temperature of at least 900° C. in the presence of $N_2$.

9. A method as set forth in claim 6 wherein said annealing of the nitrided gate dielectric of silicon dioxide includes heating the nitrided gate dielectric of silicon dioxide to a temperature of at least 900° C. in the presence of NO.

10. A method as set forth in claim 6 wherein said growing of the gate dielectric of silicon dioxide is conducted so that the gate dielectric of silicon dioxide has a thickness less than 22 angstroms.

11. A method as set forth in claim 6 wherein said growing of the gate dielectric of silicon dioxide is conducted so that the gate dielectric of silicon dioxide has a thickness ranging from 10–20 angstroms.

12. A method of making a semiconductor device having a gate with improved dielectric properties comprising:

providing a silicon based substrate having active areas defined therein;

heating the silicon based substrate in the presence of oxygen to grow a gate dielectric of silicon dioxide;

heating the gate dielectric of silicon dioxide in the presence of a $NH_3$ to provide a nitrided gate dielectric of silicon dioxide and to increase the dielectric constant of the gate dielectric of silion dioxide without substantially increasing the thickness of the gate dielectric of silicon dioxide, and further comprising driving out any hydrogen remaining in the nitrided gate dielectric of silicon dioxide.

13. A method as set forth in claim 12 wherein the gate dielectric of silicon dioxide has a thickness less than 22 angstroms.

14. A method as set forth in claim 12 further comprising heating the nitrided gate dielectric of silicon dioxide to a temperature of at least 900° C. in the presence of a $N_2$.

15. A method as set forth in claim 12 further comprising heating the nitrided gate dielectric of silicon dioxide to a temperature of at least 900° C. in the presence of the NO.

16. A method as set forth in claim 12 further comprising heating the nitrided gate dielectric of silicon dioxide to a temperature of at least 900° C. in the presence of a $N_2$ and thereafter heating the nitrided gate dielectric of silicon dioxide to a temperature of at least 900° C. in the presence of the NO.

* * * * *